United States Patent [19]
Tanaka et al.

[11] Patent Number: 5,446,016
[45] Date of Patent: Aug. 29, 1995

[54] METHOD FOR FORMING A PATTERNED OXIDE SUPERCONDUCTOR THIN FILM

[75] Inventors: So Tanaka; Takao Nakamura; Michitomo Iiyama, all of Osaka, Japan

[73] Assignee: Sumitomo Electric Industries, Ltd., Osaka, Japan

[21] Appl. No.: 196,541

[22] Filed: Feb. 15, 1994

[30] Foreign Application Priority Data

Feb. 15, 1993 [JP] Japan ................. 5-048618
Apr. 26, 1993 [JP] Japan ................. 5-121966
Oct. 12, 1993 [JP] Japan ................. 5-279091

[51] Int. Cl.$^6$ ............................. H01L 39/24
[52] U.S. Cl. ....................... 505/329; 505/410; 505/413; 505/473; 505/192; 505/728; 505/702; 427/62; 427/63; 257/33; 216/3
[58] Field of Search ............... 505/329, 413, 473, 410, 505/702, 728, 701, 192; 156/659.1, 643; 427/62, 63; 257/33

[56] References Cited

U.S. PATENT DOCUMENTS 5,196,395 3/1993 James et al. ................. 505/702
5,198,413 3/1993 Tarutani et al. ............. 505/702

FOREIGN PATENT DOCUMENTS 1-241874 9/1989 Japan .

OTHER PUBLICATIONS

Ma et al, "Novel method of patterning YBaCuO Superconducting thin films", Appl. Phys. lett. 55(9) Aug. 1989, pp. 896–898.
Copetti et al, "Improved inhibit patterning of $Y_1Ba_2Cu_3O_7$ thin films", Appl. Phys. lett 61(25) Dec. 1992, pp. 3041–3043.
Yamada et al, "Ultrathin metal films on silicon substrates for the growth of oxide superconductor overlayers", Proc. Int. Conf. Electron. Mater. 2nd, Edited by Chang et al. (1990), pp. 387–392.

*Primary Examiner*—Roy V. King
*Attorney, Agent, or Firm*—Foley & Lardner

[57] ABSTRACT

A method for forming a patterned oxide superconductor thin film on a substrate comprises steps of forming a metal or semi-metal layer on a portion of the substrate, on which the oxide superconductor thin film will be formed, forming a layer of a material including silicon on a portion of the substrate, on which an insulating layer will be formed, removing the metal or semi-metal layer and depositing an oxide superconductor thin film over the substrate.

17 Claims, 7 Drawing Sheets

METHOD FOR FORMING A PATTERNED OXIDE SUPERCONDUCTOR THIN FILM

BACKGROUND OF THE INVENTION

1 Field of the Invention

The present invention relates to a method for forming a patterned oxide superconductor thin film, more specifically to a method for forming a patterned oxide superconductor thin film without degrading the oxide superconductor thin film itself.

2. Description of Related Art

Devices which utilize superconducting phenomena operate rapidly with low power consumption so that they have higher performance than conventional semiconductor devices. Particularly, by using an oxide superconducting material which has been recently advanced in study, it is possible to produce a superconducting device which operates at relatively high temperature. Researches on Josephson junction devices, superconducting transistors, superconducting field effect devices, etc. utilizing those oxide superconductors are now in progress.

A Josephson junction device which is one of well known superconducting devices can be realized in various structures. Among the various structures, the most preferable structure in practice is a stacked junction realized by a thin non-superconductor layer sandwiched between a pair of superconductors. However, a point contact type junction, a micro bridge type junction and a variable thickness bridge type junction which are composed of a pair of superconductor regions which are weakly linked to each other also exhibit Josephson effect.

Since these Josephson junctions have fine structures which are in order of a few times of the coherent length, it is difficult to obtain Josephson junction devices having homogeneous and stable properties. In particular, oxide superconductors are easily degraded during processings so that it is difficult to manufacture Josephson junction devices of the above types utilizing oxide superconductors having excellent properties.

In order to resolve the above problems, there is proposed a different type junction which can be manufactured by using oxide superconductors without fine processings. This type of a Josephson junction is so called a grain boundary type Josephson junction which consists of two superconducting electrodes formed of single crystal films of an oxide superconductor having different crystalline orientations and a grain boundary between them. In this type of the Josephson junction, the two superconducting electrodes are considered to be weakly linked through the grain boundary so that the grain boundary forms a weak link of a Josephson junction.

This type of the Josephson junction is manufactured by depositing an oxide superconductor thin film on a single crystalline substrate having a trench on its deposition surface under a condition suitable for growing a single crystalline oxide superconductor thin film. A grain boundary is automatically formed in the oxide superconductor thin film at the trench portion. Since, a different lattice plane is exposed at the trench portion of the substrate which have an effect on a crystal orientation of the oxide superconductor thin film growing at the trench portion. For this purpose, the step should be sharply formed.

Though the Josephson junction device is one of the most famous superconducting devices, logic circuits may be more easily assembled by using so called superconducting-base transistors or so called super-FETs (field effect transistor) which are three-terminal superconducting devices than by using Josephson junction devices which are two-terminal superconducting devices. Therefore, the superconducting-base transistor and the super-FET are more practical.

These superconducting devices have superconducting parts as superconducting electrodes, superconducting channels etc. These superconducting parts are usually formed of superconducting thin films.

To apply superconducting devices to various electronic equipments, these superconducting devices need to be incorporated within an IC (integrated circuit). There are many element devices on a substrate of an IC and each element device region is isolated. A superconducting thin film which has an isolated superconducting region is necessary to isolate a superconducting device region which is incorporated within IC. In case of a superconducting device formed of an oxide superconductor material which has been recently advanced in study, an oxide superconductor thin film which has an isolated superconducting region is necessary.

Researches are also advanced in applications of oxide superconductors to microwave circuits. In general, a microstrip line used in the microwave circuit has an attenuation coefficient that is attributable to a resistance component of the conductor. This attenuation coefficient attributable to the resistance component increases in proportion to a root of a frequency. On the other hand, the dielectric loss increases in proportion to the frequency. Therefore, if the resistance of the conductor in the strip line can be reduced, it is possible to greatly improve the high frequency characteristics of the microstrip line. Namely, by using a superconducting microstrip line, the loss can be significantly decreased and microwaves of higher frequency range can be transmitted. In particular, the loss is lower in the oxide superconducting microstrip line than in the normal microstrip line utilizing Cu for the conductor at a frequency of up to about 100 GHz.

Additionally, microwaves are characterized by a straight-going property of radio waves and small diffraction due to their short wave length of a few millimeters to several tens centimeters. Therefore, special and unique methods and devices are needed for handling microwaves.

As regards impedance elements such as L, C, R, suitable ones for microwave circuits have different shapes from those of ordinary electronic circuits. Discrete elements which usually become distributed elements in the microwave circuits are not suitable due to their properties and large size, which becomes an obstacle for manufacturing high density integrated microwave circuits. In addition, the discrete elements can not prepared simultaneously with microwave circuits, so that the discrete elements are attached to the microwave circuits afterwards. In this case, microwave reflection would occur at a connection between a discrete element and a circuit due to discontinuity of transmission line, so that properties of the microwave circuit become lowered.

On the other hand, lumped elements have smaller dimensions and can be formed as a part of microstrip lines. Therefore, it is possible to prepare lumped elements simultaneously with microwave circuit so that monolithic microwave integrated circuits can be obtained.

Since the above lumped elements are prepared by processing microstrip lines, it can be clearly understood that oxide superconductors are easily applied to the above lumped elements, which significantly improve their properties than conventional materials than conventional materials.

In a prior art, in order to prepare the oxide superconducting devices, a patterned thin film of a material including silicon, for example a patterned $SiO_2$ thin film is at first formed on a substrate. Then, an oxide superconductor thin film is formed over the substrate. Silicon diffuses into the oxide superconductor thin film on the $SiO_2$ thin film so that the oxide superconductor thin film there becomes nonsuperconducting. The other portion of the oxide superconducting thin film growing directly on the substrate becomes superconducting, so that a superconducting device consisting of the patterned oxide superconductor thin film is completed.

In the above methods the $SiO_2$ thin film is mostly patterned by a lift-off process. Namely, a photoresist layer is formed on a portion of the substrate and the $SiO_2$ thin film is deposited over the substrate and on the photoresist. Then, the photoresist layer is removed with a portion of $SiO_2$ thin film on the photoresist layer. The substrate is disposed at the portion at which the photoresist layer is removed.

However, in the above prior art the substrate is reacted with the photoresist and/or photoresist: remover so that defects and residual spots are generated at the surface of the substrate. An oxide superconductor thin film formed on these imperfect surfaces of the substrates have worse superconducting properties than expected, so that the superconducting devices do not show enough performances.

SUMMARY OF THE INVENTION

Accordingly, it is an object of the present invention to provide a method for forming a patterned oxide superconductor thin film, which have overcome the above mentioned defects of the conventional ones.

Another object of the present invention is to provide a method for manufacturing a superconducting microwave lumped element, which have overcome the above mentioned defects of the conventional ones.

Still another object of the present invention is to provide a method for manufacturing a Josephson junction device, which have overcome the above mentioned defects of the conventional ones.

The above and other objects of the present invention are achieved in accordance with the present invention by a method for forming a patterned oxide superconductor thin film on a substrate comprising steps of forming a metal or semi-metal layer on a portion of the substrate, on which the oxide superconductor thin film will be formed, forming a layer of a material including silicon on a portion of the substrate, on which an insulating layer will be formed, sublimating the metal or semi-metal layer and depositing an oxide thin film over the substrate to deposit superconducting and insulating layers simultaneously.

Preferably, the substrate is processed by using ion beam over the metal or semi-metal layer. In this case, the metal or semi-metal layer prevents the substrate from charging tip. Therefore, the ion beam is not refracted or reflected so that accurate patterning can be conducted.

According to another aspect of the present invention, there is provided a method of preparing a superconducting microwave lumped element, comprising the steps of forming on a deposition surface of a substrate a metal or semi-metal layer, patterning the metal or semi-metal layer so that the metal or semi-metal layer remains on a portion of the substrate, on which superconducting portion of the element will be disposed, forming a layer of a material including silicon on a portion of the substrate, on which an insulating layer will be formed, sublimating the metal or semi-metal layer by heating the substrate under vacuum, depositing an oxide superconductor thin film over the substrate and producing the superconducting and insulating layers simultaneously.

According to still another aspect of the present invention, there is provided a method of preparing a Josephson junction device, comprising the steps of forming on a deposition surface of a substrate a metal or semi-metal layer, patterning the metal or semi-metal layer so that the metal or semi-metal layer remains on a portion of the substrate, on which the superconducting portion of the device will be disposed, forming a layer of a material including silicon on a portion of the substrate on which an insulating layer will be formed, etching the substrate over the metal or semi-metal layer by using ion beam so as to form a trench, removing the metal or semi-metal layer by heating the substrate under vacuum, depositing an oxide superconductor thin film over the substrate so that the oxide superconductor thin film includes a first and a second electrodes respectively positioned each side of the trench of the substrate, which are constituted of single crystals of the oxide superconductor, a junction portion on the trench of the substrate, which are constituted of a single crystal of the oxide superconductor having a different crystal orientation from the first and second superconducting electrodes, and grain boundaries between the first superconducting electrode and the junction portion and between the second superconducting electrode and the junction portion, which constitute substantially one weak link of the Josephson junction.

In a preferred embodiment, the oxide superconductor is formed of high-$T_c$ (high critical temperature) oxide superconductor, particularly, formed of a high-$T_c$ copper-oxide type compound oxide superconductor for example a Y-Ba-Cu-O compound oxide superconductor material, a Bi-Sr-Ca-Cu-O compound oxide superconductor material, and a Tl-Ba-Ca-Cu-O compound oxide superconductor material.

In addition, the substrate can be formed of an insulating substrate, preferably an oxide single crystalline substrate such as MgO, $SrTiO_3$, $CdNdAlO_4$, etc. These substrate materials are very effective in forming or growing a crystalline film having a high degree of crystalline orientation.

The above and other objects, features and advantages of the present invention will be apparent from the following description of preferred embodiments of the invention with reference to the accompanying drawings.

DESCRIPTION OF THE PREFERRED EMBODIMENTS

Embodiment 1

Referring to FIGS. 1A to 1G and 2, the method in accordance with the present invention for forming a patterned oxide superconductor thin film will be described. In this embodiment, the patterned oxide superconductor thin film was used so as to form a superconducting interdigital type capacitor which is one of planar microwave lumped elements.

Figure 1A:
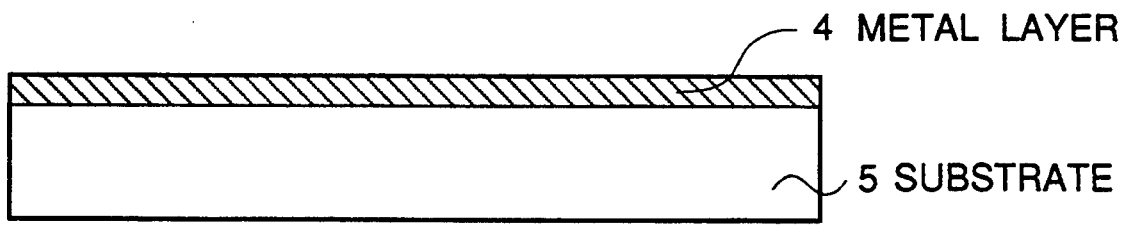
FIGS. 1A, 1B, 1C, 1D, 1E, 1F and 1G are sectional views for illustrating an embodiment of the method in accordance with the present invention for forming a patterned oxide superconductor thin film.

As shown in FIG. 1A, a metal layer 4 of bismuth having a thickness of 50 nanometers was deposited on a $SrTiO_3$ single crystalline substrate 5 having a substantially planar deposition surface by evaporation method. The metal layer 4 protected the deposition surface of the substrate 5. For this purpose, the metal layer should have a thickness of 10 to 200 nanometers. If the thickness of the metal layer 4 is too small, it can not protect the deposition surface of the substrate. If the thickness of the metal layer 4 is too large, it becomes difficult to remove the metal layer 4 completely. The metal layer 4 is preferably formed of bismuth, selenium, tellurium, lead, thallium, antimony or arsenic. These metals and semi-metals do not affect substrates, suitable for depositing oxide superconductor thin films afterwards. In addition, metal layers of these metals can be easily sublimated by heating substrates in a vacuum.

Figure 1B:
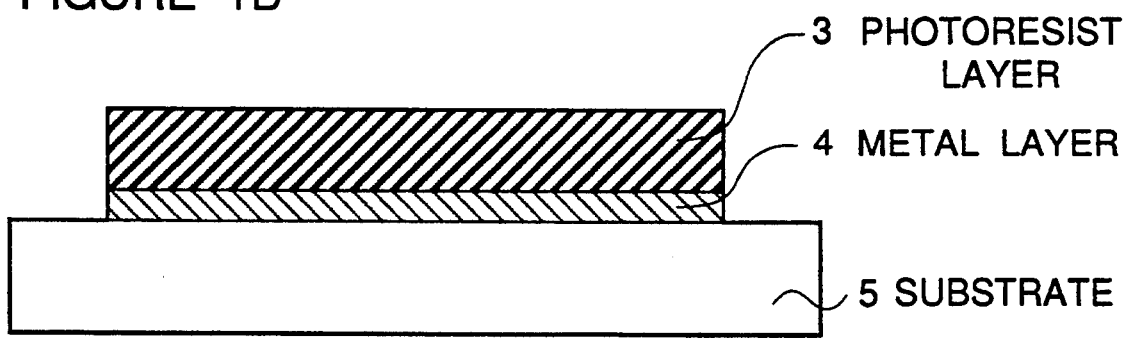

Then, as shown in FIG. 1B, a photoresist layer 3 was formed on a portion of the metal layer 4 by ordinary photolithography so that exposed portions of the metal layer 4 could be removed. The portions of the metal layer 4 is preferably etched and removed by using acid such as $HNO_3$ or by ion beam sputtering under an ordinary temperature.

Figure 1C:
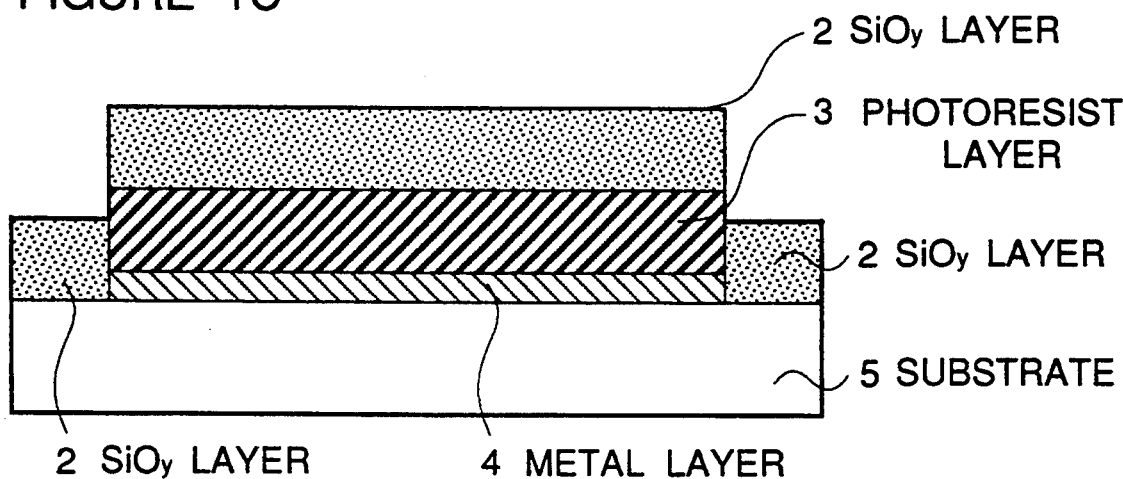

As shown in FIG. 1C, a $SiO_y$ ($0<y<2$) layer 2 was formed over the substrate 5 by evaporation method. In this process, SiO was used as an evaporation source. The deposited layer 2 consisted of $SiO_y$. The $SiO_y$ layer 2 preferably has a thickness of 50 to 60 nanometers. In addition, Si can be used instead of $SiO_y$.

Figure 1D:
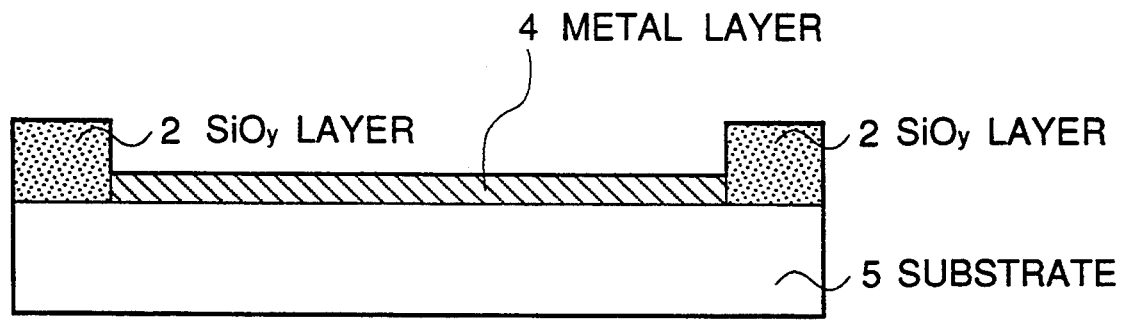

Thereafter, the photoresist layer 3 was removed with a portion of the $SiO_y$ layer 2 on it so that the $SiO_y$ layer 2 was remained only on portions of the substrate 5, as shown in FIG. 1D. Insulating regions would be formed at the remained $SiO_y$ layer 2.

Figure 1E:
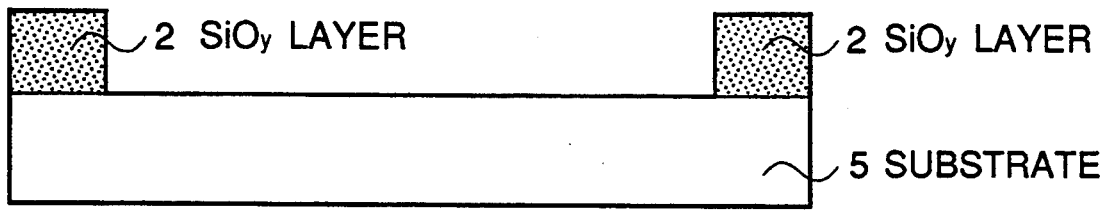

Then, the substrate 5 was carried into a vacuum apparatus so that the substrate 5 was heated to a temperature of 400° C. for five minutes under a pressure of $1 \times 10^{-9}$ Torr. The metal layer 4 of bismuth sublimated and was removed so that a portion of the substrate 5 was exposed, as shown in FIG. 1E. Simultaneously, contaminants on the metal layer 4 and the substrate 5 were removed with the metal layer 4.

In this process, the pressure is preferably lower than $1 \times 10^{-7}$ Torr and the substrate is preferably heated to a temperature of 400° to 500° C. However, the substrate can be heated to any temperature of not lower than 400° C. to 700° C. which is suitable for depositing an oxide superconductor thin film.

In this embodiment, the above heat-treatment was conducted by using a film deposition apparatus and all the succeeding processes were conducted in the same apparatus so that the substrate 5 and an oxide superconductor thin film which would be deposited on it were not exposed to the air. By this the exposed surface of the substrate 5 and the oxide superconductor thin film were not contaminated and degraded.

Figure 1F:
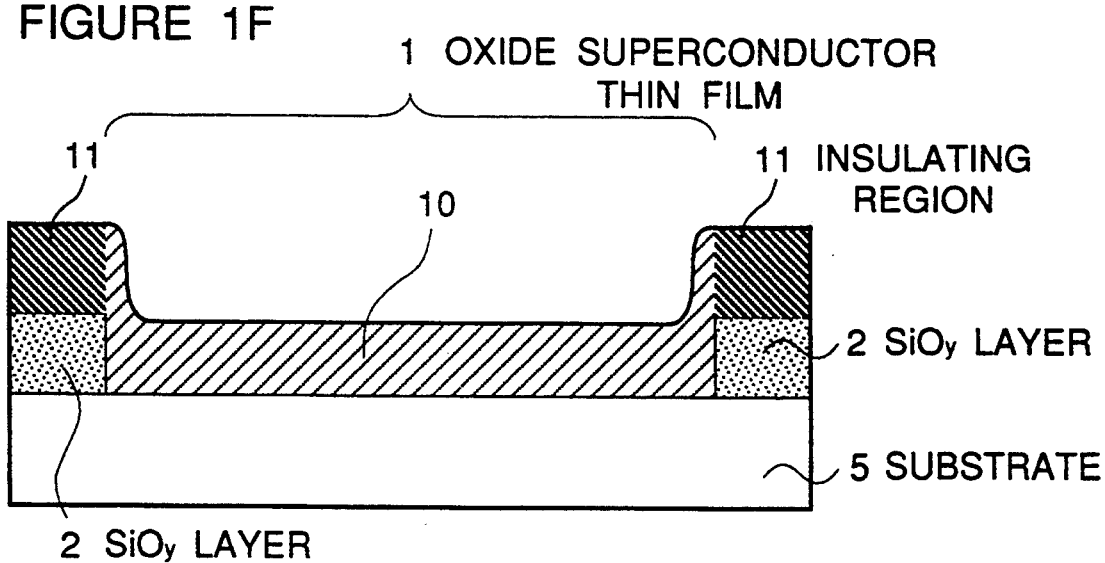

Thereafter, as shown in FIG. 1F, a $Y_1Ba_2Cu_3O_{7-\delta}$ oxide superconductor thin film I having a thickness of 20 to 40 nanometers was deposited on the substrate 5 by, for example, off-axis sputtering, reactive co-evaporation, MBE (molecular beam epitaxy), CVD or laser ablation, etc. The condition of forming the $Y_1Ba_2Cu_3O_{7-\delta}$ oxide superconductor thin film I by off-axis sputtering was as follows:

| Sputtering Gas | |
|---|---|
| Ar: | 90% |
| $O_2$: | 10% |
| Total pressure | 10 Pa |
| Temperature of the substrate | 700–750° C. |

Silicon included in the $SiO_y$ layer 2 defused into the $Y_1Ba_2Cu_3O_{7-\delta}$ oxide superconductor thin film I on the $SiO_y$ layer 2 so that the portion of the $Y_1Ba_2Cu_3O_{7-\delta}$ oxide superconductor was converted into an oxide insulator and isolation regions 11 were formed. A portion of the $Y_1Ba_2Cu_3O_{7-\delta}$ oxide superconductor thin film 21 directly deposited on the substrate 5 became a superconducting region 10 formed of a high crystallinity c-axis orientated $Y_1Ba_2Cu_3O_{7-\delta}$ oxide superconductor crystal.

By this a patterned oxide superconductor thin film was completed by the method in accordance with the present invention. The above method can be called as a selective epitaxial deposition method. Since diffusion of silicon is utilized, this selective epitaxial deposition method can not be applied to fine patterning of oxide superconductor thin films in which patterns less than 1 $\mu m$ are formed.

The patterned oxide superconductor thin film can be used for preparing superconducting devices. For example, if the superconducting region 10 is processed so as to form a superconducting channel, superconducting source region and superconducting drain region, and a gate electrode are formed on the superconducting channel through a gate insulating layer, a superconducting field effect device can be prepared. If the superconducting region is processed so as to have an appropriate shape, a superconducting microwave element can be prepared.

In this embodiment, the patterned oxide superconductor thin film was processed so as to prepare a superconducting microwave interdigital type capacitor. The process will be explained hereinafter.

Figure 1G:
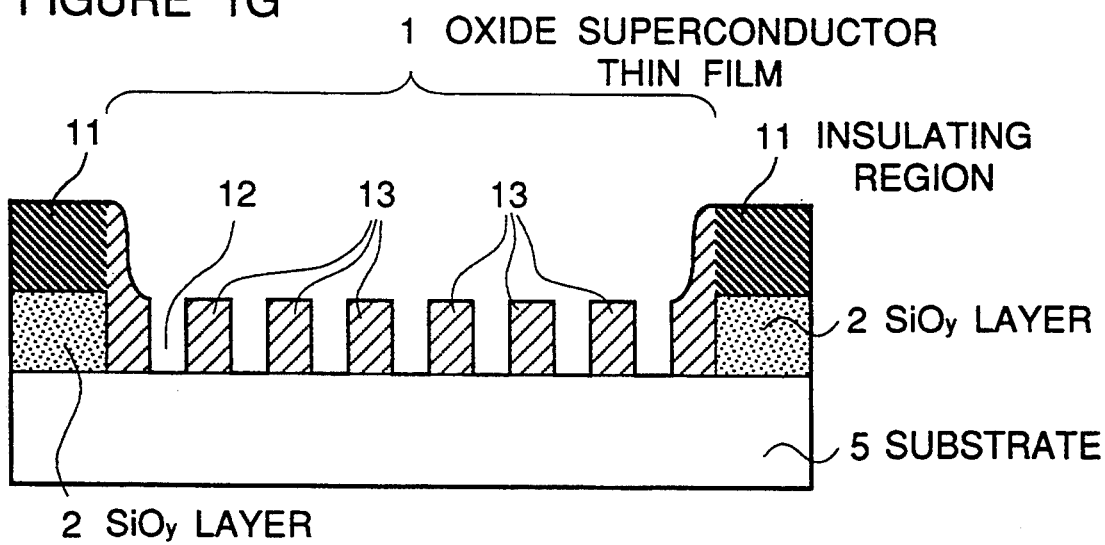
Figure 2:
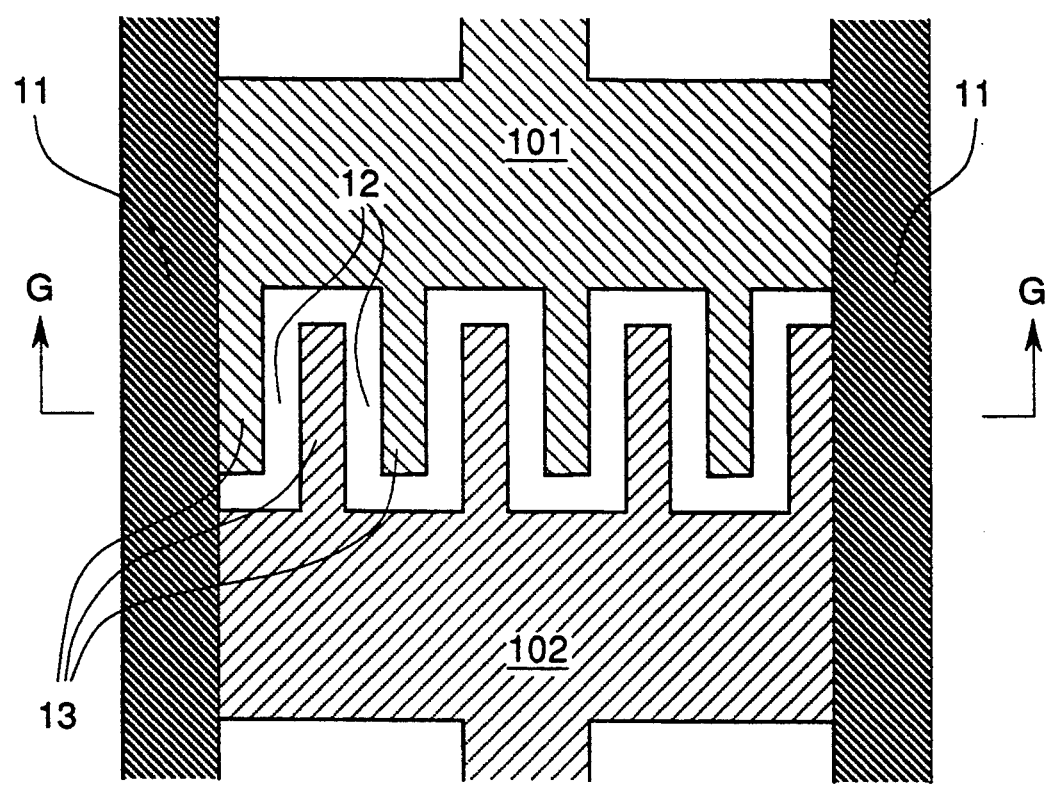
FIG. 2 is a plane view of a superconducting microwave lumped element prepared by the method in accordance with the present invention.

As shown in FIG. 1G and 2, a trench 12 was formed at the superconducting region 10 by focussed ion beam etching using Ga ion so as to divide the superconducting region 10 into one pair of superconducting electrodes 101 and 102 having finger portions 13, so that the superconducting interdigital type capacitor was completed by the method in accordance with the present invention. FIG. 1G shows a sectional view of the superconducting interdigital type capacitor taken on line G-G of the FIG. 2. A condition of the focussed ion beam etching was as follows:

| Acceleration voltage of Ga ion | 100 kV |
|---|---|
| Ion current | 500 pA |
| Beam diameter | 0.1 μm |

In this etching process, by using a focussed ion beam apparatus combined with a SEM (Scanning Electron Microscope), the trench 12 was accurately positioned and fine processing was conducted. The trench 12 had a width of 200 nanometers and a depth of 50 nanometers in order to completely remove the oxide superconductor thin film at the trench portion. The interdigital type capacitor has a capacitance C expressed by a following formula:

$$C = \epsilon \times d/s$$

ε: dielectric constant of the substrate 5
d : thickness of the oxide superconductor thin film 1
s : width of the trench 12

Therefore, if the spacing s is not less than 1 μm, this patterning can be also conducted above selective epitaxial deposition method. In this case, the interdigital type capacitor can be prepared without direct processing of the superconducting portion of the oxide superconductor. This is very effective for preparing the superconducting microwave interdigital type capacitor of high performance.

Additionally, by filling the trench 12 with a dielectric material having different dielectric constant from the substrate 5, capacitance C of the above interdigital type capacitor can be easily changed.

As explained above, if an oxide superconductor thin film is patterned in accordance with the first embodiment of the method of the present invention, the patterned oxide superconductor thin film consists of a high quality oxide superconductor crystal so as to have excellent superconducting characteristics. Since, the oxide superconductor thin film is deposited on a substrate of which a deposition surface is protected by a metal layer just prior to depositing the oxide superconductor thin film. In addition, the deposition surface is cleaned when the metal layer is sublimated and removed. Furthermore, the deposition surface of the substrate and the oxide superconductor thin film are not exposed to air until all the processes are completed so that they are not contaminated or degraded in the processes. Therefore, a superconducting device and a circuit of high performance can be easily manufactured in accordance with the present invention.

Embodiment 2

Referring to FIGS. 3A to 3G and 4A to 4G, a second embodiment of the method in accordance with the present invention for forming a patterned oxide superconductor thin film will be described. In this embodiment, the oxide superconductor thin film was patterned so as to form a step type Josephson junction device.

Figure 3A:
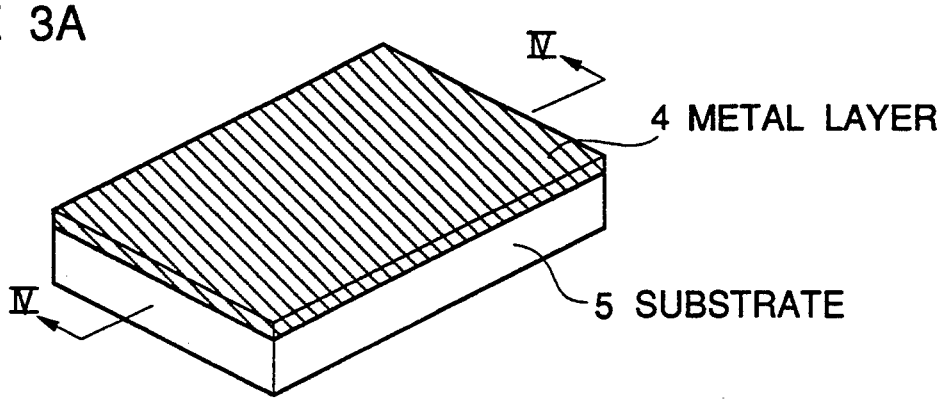
FIGS. 3A, 3B, 3C, 3D, 3E, 3F and 3G are perspective views for illustrating another embodiment of the method in accordance with the present invention for forming a patterned oxide superconductor thin film.
Figure 4A:
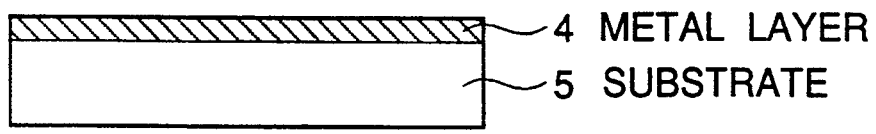
FIGS. 4A, 4B, 4C, 4D, 4E, 4F and 4G are sectional views taken on lines IV-IV to FIGS. 3A to 3G.

As shown in FIGS. 3A and 4A, a metal layer 4 of bismuth having a thickness of 50 nanometers was deposited on a SrTiO$_3$ single crystalline substrate 5 having a substantially planar deposition surface by evaporation method. The metal layer 4 prevents charge up of the substrate 5 when the substrate 5 is etched by ion beam etchings or sputtering etchings. The metal layer 4 is preferably formed of bismuth, selenium, tellurium, lead, thallium, antimony or arsenic. These metals and semimetals do not affect substrates suitable for depositing oxide superconductor thin films. In addition, metal layers of these metals can be easily sublimated by heating substrates in a vacuum.

The metal layer 4 preferably has a thickness of 50 to 200 nanometers, which is determined by the kind of metal, the kind of ion used for processing the substrate and acceleration voltage. If the metal layer 4 is too thick, an ion beam hardly reaches the deposition surface of the substrate 5 so that it is difficult to process the substrate 5. If the metal layer 4 is too thin, it does not give the desired effect or it is lost during the processing. For example, Ga ion accelerated by a voltage of 100 kV, which is used in focussed ion etching, enters an object to a depth of on the order of 300 nanometers from a surface. Therefore, if the thickness of the metal layer 4 are in the above range, the substrate 5 can be processed by using ion beams over the metal layer 4.

Figure 3B:
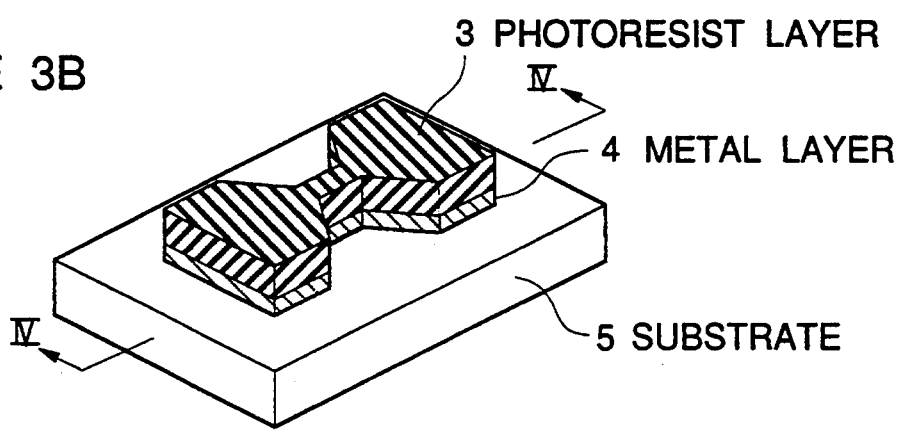
Figure 4B:
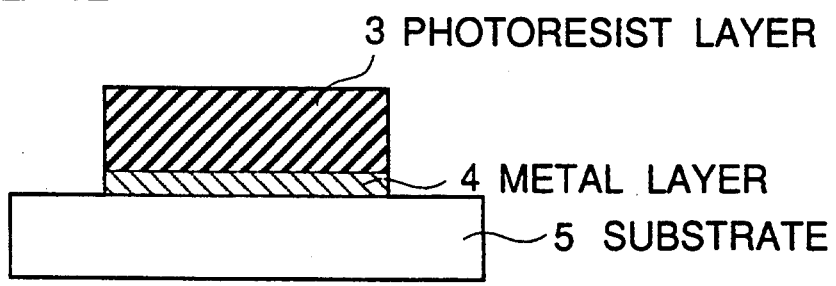

Then, as shown in FIGS. 3B and 4B, a photoresist layer 3 was formed on a portion of the metal layer 4 so as to form a pattern of the Josephson junction device so that exposed portions of the metal layer 4 were removed by using weak HNO$_3$ solution. The portions of the metal layer 4 is preferably etched and removed by using acid such as HNO$_3$ or by ion beam sputtering under an ordinary temperature.

Figure 3C:
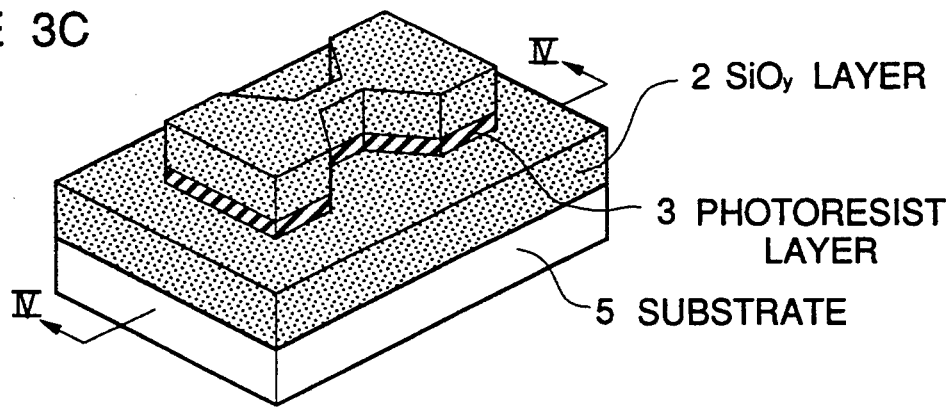
Figure 4C:
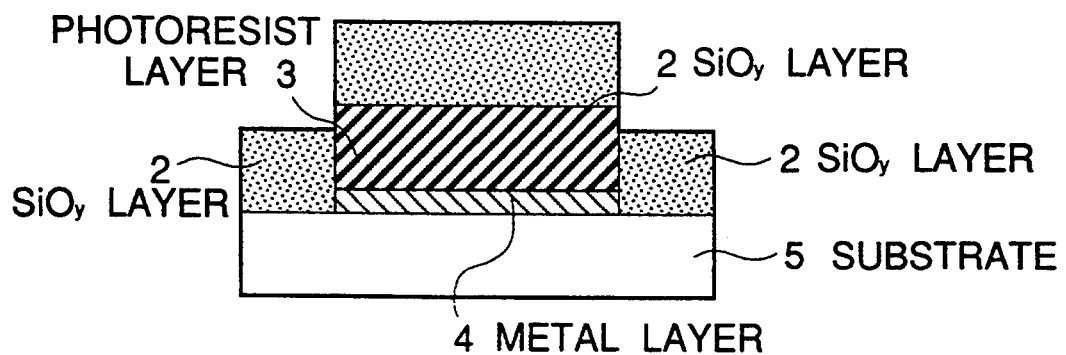

As shown in FIGS. 3C and 4C, a SiO$_y$ (0 < y < 2) layer 2 was formed over the substrate 5 by evaporation method. In this process, SiO was used as an evaporation source. The deposited layer 2 consisted of SiO$_y$. The SiO$_y$ layer 2 preferably has a thickness of 50 to 60 nanometers. In addition, Si can be used instead of SiO$_y$.

Figure 3D:
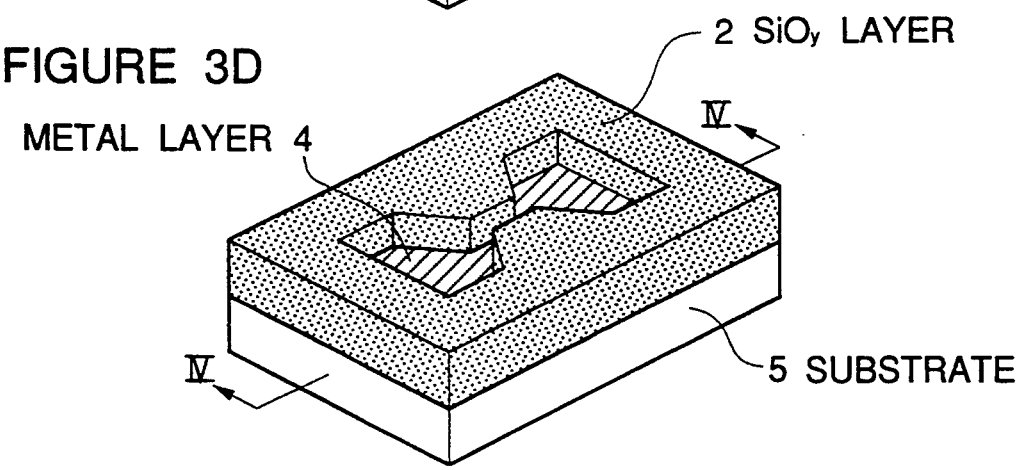
Figure 4D:
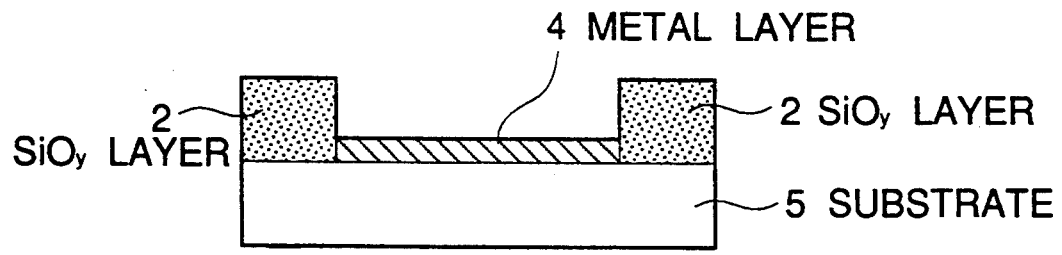

Thereafter, the photoresist layer 3 was removed with a portion of the SiO$_y$ layer 2 on it so that the SiO$_y$ layer 2 was remained on portions of the substrate 5, as shown in FIGS. 3D and 4D. Insulating regions would be formed on the remained SiO$_y$ layer 2 and the Josephson junction device would be formed on tile exposed metal layer 4.

Figure 3E:
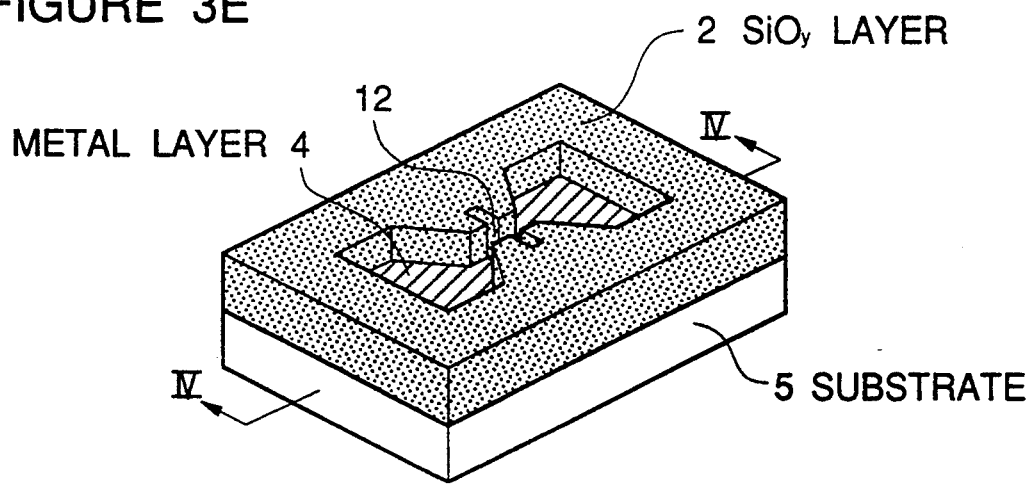
Figure 4E:
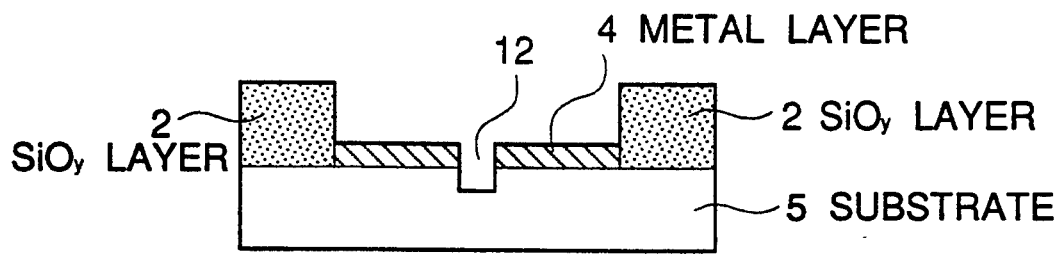

As shown in FIGS. 3E and 4E, a trench 12 was formed at a narrow portion of tile Josephson junction device by focussed ion beam etching using Ga ion. A condition of the focussed ion beam etching was as follows:

| Acceleration voltage of Ga ion | 100 kV |
|---|---|
| Ion current | 500 pA |
| Beam diameter | 0.1 μm |

In this etching process, by using a focussed ion beam apparatus combined with a SEM, the trench 12 was accurately positioned and fine processing was conducted. The trench 12 had a width of 300 nanometers and a depth of 100 nanometers so that the trench 12 cut into the substrate 5.

In this embodiment, the above focused ion etching process was conducted by using a film deposition apparatus connected with the focussed ion beam apparatus and all the succeeding processes were conducted in the apparatus so that the substrate 5 and an oxide superconductor thin film which would be deposited on it were not exposed to the air. By this the trench 12 of the substrate 5 and the oxide superconductor thin film were not contaminated and degraded.

Figure 3F:
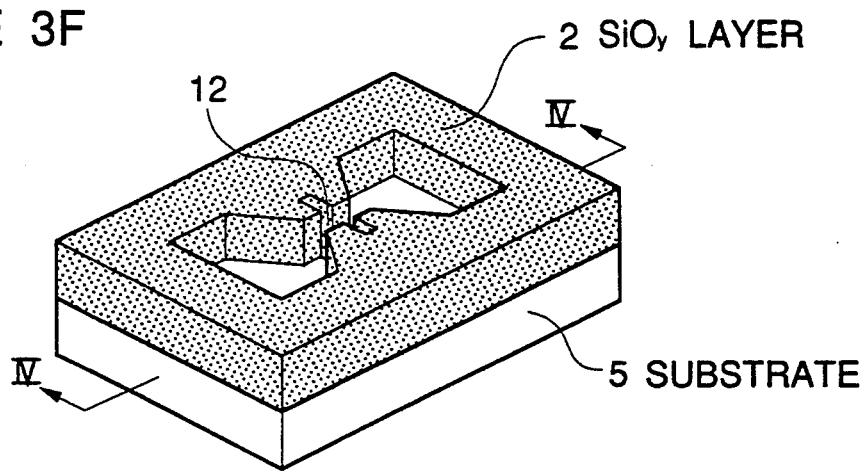
Figure 4F:
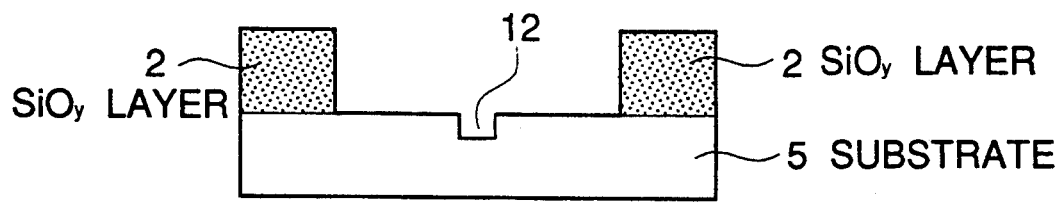

Then, the substrate 5 was heated to a temperature of 500° C. for five minutes under a pressure of $1 \times 10^{-9}$ Torr. The metal layer 4 of bismuth sublimated and was removed so that a portion of the substrate 5 was exposed, as shown in FIGS. 3F and 4F. Simultaneously, contaminants on the metal layer 4 and the substrate 5 were removed with the metal layer 4.

Figure 3G:
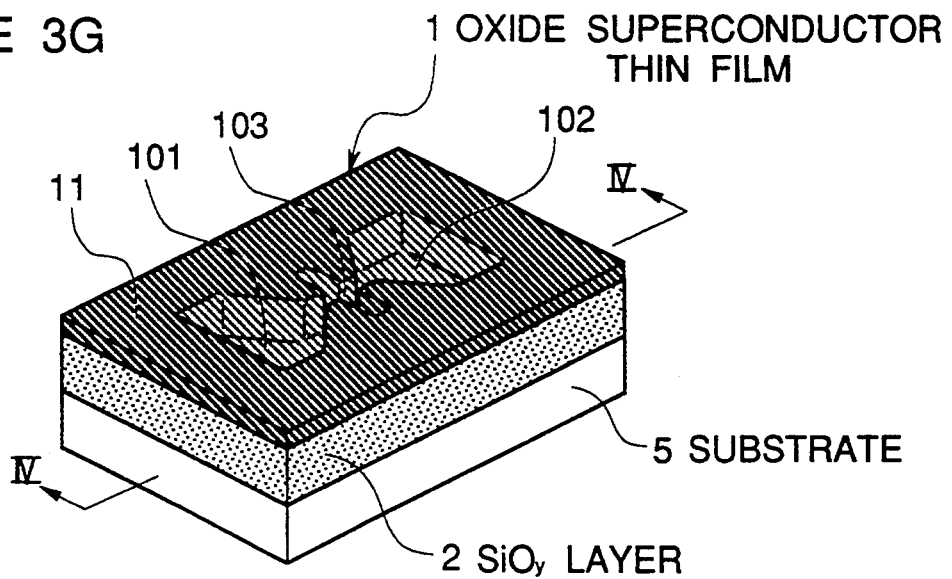
Figure 4G:
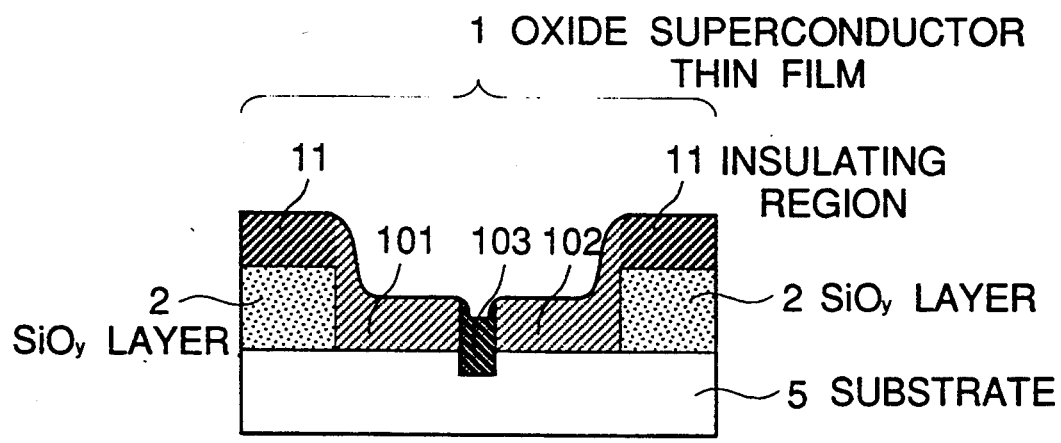

Finally, as shown in FIGS. 3G and 4G, a $Y_1Ba_2Cu_3O_{7-\delta}$ oxide superconductor thin film I having a thickness of 200 nanometers was deposited on the substrate 5 by off-axis sputtering. The $Y_1Ba_2Cu_3O_{7-\delta}$ oxide superconductor thin film can be deposited also by reactive co-evaporation, MBE (molecular beam epitaxy), CVD or laser ablation, etc. The condition of forming the $Y_1Ba_2Cu_3O_{7-\delta}$ oxide superconductor thin film 1 by off-axis sputtering was as follows:

| Sputtering Gas | |
| --- | --- |
| Ar: | 90% |
| $O_2$: | 10% |
| Total pressure | 10 Pa |
| Temperature of the substrate | 700–750° C. |

Silicon included $SiO_y$ layer 2 defused into the $Y_1Ba_2Cu_3O_{7-\delta}$ oxide superconductor thin film 1 on the $SiO_y$ layer 2 so that the portion of the $Y_1Ba_2Cu_3O_{7-\delta}$ oxide superconductor was converted into an oxide insulator and insulating regions 11 were formed. Portions of the $Y_1Ba_2Cu_3O_{7-\delta}$ oxide superconductor thin film 1 directly deposited on the deposition surface of the substrate 5 became superconducting electrodes 101 and 102 formed of a high crystallinity c-axis orientated $Y_1Ba_2Cu_3O_{7-\delta}$ oxide superconductor crystals. On the contrary, a portion 103 of the $Y_1Ba_2Cu_3O_{7-\delta}$ oxide superconductor thin film 1 on the trench 12 was formed of a $Y_1Ba_2Cu_3O_{7-\delta}$ oxide superconductor crystal having a different crystal orientation from those of the superconducting electrodes 101 and 102. Therefore, grain boundaries were formed between the superconducting electrode 101 and the superconducting electrode 102. Since these grain boundaries were close to each other, it seemed as if they constituted a weak link of a Josephson junction.

A current-voltage characteristics of the above mentioned Josephson junction device was measured under cooling with a liquid nitrogen. When a microwave was irradiated, clear Shapiro steps were observed, and therefore, it could be ascertained that the Josephson junction was realized in the device.

As explained above, if an oxide superconductor thin film is patterned in accordance with the second embodiment of the method of the present invention, an accurately patterned oxide superconductor thin film can be obtained. Since, by means of a metal layer, a substrate on which the oxide superconductor thin film is deposited can be processed by various ion beam etchings or sputtering etchings without charge up of the substrate. In addition, the deposition surface is cleaned when the metal layer is sublimated and removed. Furthermore, the deposition surface of the substrate and the oxide superconductor thin film are not contact with air until all the processes are completed so that they are not contaminated or degraded in the processes. Therefore, a superconducting device and a circuit of high performance can be easily manufactured in accordance with the present invention.

In the above mentioned embodiment, the oxide superconductor thin film can be formed of not only the Y-Ba-Cu-O compound oxide superconductor material, but also a high-$T_c$ (high critical temperature) oxide superconductor material, particularly a high-$T_c$ copper-oxide type compound oxide superconductor material, for example a Bi-Sr-Ca-Cu-O compound oxide superconductor material, and a Tl-Ba-Ca-Cu-O compound oxide superconductor material.

The substrate can be formed of for example, an insulator substrate such as a MgO (21.00) substrate, a $SrTiO_3$ (100) substrate, a $CdNdAlO_4$ (001) substrate or others.

The invention has thus been shown and described with reference to the specific embodiments. However, it should be noted that the present invention is in no way limited to the details of the illustrated structures but converts and modifications may be made within the scope of the appended claims.

We claim:

1. A method for forming a patterned oxide superconductor thin film on a substrate comprising the steps of:
   forming a metal or semi-metal layer on a first portion of the substrate, on which portion of the substrate an oxide superconductor thin film will be formed,
   forming a layer of a material containing silicon on a second portion of the substrate, on which portion of the substrate an insulating layer will be formed, wherein the second portion is surrounding the first portion of the substrate,
   removing the metal or semi-metal layer and depositing the oxide superconductor thin film over the whole substrate.

2. A method claimed in claim 1 wherein the substrate is etched by using an ion beam over the metal or semi-metal layer.

3. A method claimed in claim 1 wherein the method is conducted so that the portion of the substrate covered with tile metal or semi-metal layer is not exposed to the air.

4. A method claimed in claim 1 wherein the metal or semi-metal layer is formed of a material selected from the group consisting of bismuth, selenium, tellurium, lead, thallium, antimony and arsenic.

5. A method claimed in claim 4 wherein the metal or semi-metal layer is removed by heating the substrate under vacuum so that the metal or semi-metal sublimates.

6. A method claimed in claim 1 wherein tile oxide superconductor is formed of high-$T_c$ oxide superconductor.

7. A method claimed in claim 6 wherein the oxide superconductor is formed of oxide superconductor material selected from the group consisting of a Y-Ba-Cu-O compound oxide superconductor material, a Bi-Sr-Ca-Cu-O compound oxide superconductor material, and a Tl-Ba-Ca-Cu-O compound oxide superconductor material.

8. A method claimed in claim 1 wherein the substrate is formed of an insulator.

9. A method claimed in claim 8 wherein the substrate is formed of a material selected from the group consisting of a MgO (100) substrate, a $SrTiO_3$ (100) substrate and a $CdNdAlO_4$ (001) substrate.

10. A method of preparing a superconducting microwave lumped element, comprising the steps of:
    forming on a surface of a substrate a metal or semi-metal layer,
    patterning the metal or semi-metal layer so that the metal or semi-metal layer is removed from a first portion of the substrate but remains on a second portion of the substrate on which a superconducting portion of the microwave lumped element will be disposed, forming a layer of a material containing silicon on the first portion of the substrate, on which an insulating layer will be formed, wherein the second portion is surrounding the first portion of the substrate, removing the metal or semi-metal layer by heating the substrate under vacuum, depositing an oxide superconductor thin film over the whole substrate, and patterning the oxide superconductor thin film.

11. A method of preparing a Josephson junction device, comprising the steps of:

forming on a surface of a substrate a metal or semi-metal layer, patterning the metal or semi-metal layer so that the metal or semi-metal layer is removed from a first portion of the substrate but remains on a second portion of the substrate on which a superconducting portion of the Josephson junction device will be disposed, forming a layer of a material containing silicon on the first portion of the substrate, on which an insulating layer will be formed, wherein the first portion is surrounding the second portion of the substrate, etching the substrate over the metal or semi-metal layer by using an ion beam so as to form a trench, removing the metal or semi-metal layer by heating the substrate under vacuum, and depositing an oxide superconductor thin film over the substrate so that the oxide superconductor thin film includes first and second electrodes, respectively positioned at each side of the trench of the substrate, which are constituted of single crystals of the oxide superconductor, a junction portion on the trench of the substrate, which is constituted of a single crystal of the oxide superconductor having a different crystal orientation from the first and second superconducting electrodes, and grain boundaries between the first superconducting electrode and the junction portion and between second superconducting electrode and the junction portion, which constitute substantially one weak link of the Josephson junction.

12. A method as claimed in claim 6, wherein the high-$T_c$ oxide superconductor is a high-$T_c$ copper-oxide compound oxide superconductor.

13. A method as claimed in claim 1, wherein the metal or semi-metal is formed of a material selected from the group consisting of bismuth, selenium, tellurium, lead thallium, antimony and arsenic.

14. A method as claimed in claim 1, additionally comprising a step of patterning the oxide superconductor thin film to form a trench that divides the oxide superconductor thin film into first and second superconducting electrodes.

15. A method as claimed in claim 14, additionally comprising a step of filling the trench with a dielectric material.

16. A method as claimed in claim 15, wherein the dielectric material has a different dielectric constant than the substrate.

17. A method as claimed in claim 14, wherein the trench is formed by focussed ion beam etching.

* * * * *